United States Patent
Huang et al.

(10) Patent No.: US 6,194,234 B1
(45) Date of Patent: Feb. 27, 2001

(54) METHOD TO EVALUATE HEMISPERICAL GRAIN (HSG) POLYSILICON SURFACE

(75) Inventors: Kuo-Ching Huang, Kaohsinng; Tse-Liang Ying; Wen-Chuan Chiang, both of Hsin-Chu; Yu-Hua Lee, Hsinchu, all of (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/324,925

(22) Filed: Jun. 4, 1999

(51) Int. Cl.[7] ..................................... G01R 31/26
(52) U.S. Cl. .................. 438/14; 438/488; 438/492; 73/1.89; 73/104; 73/105
(58) Field of Search .................. 438/488; 73/1.73, 73/1.82, 1.89, 104, 105

(56) References Cited

U.S. PATENT DOCUMENTS

| | | | |
|---|---|---|---|
| 4,450,723 | * 5/1984 | Scott | 73/432 |
| 5,242,831 | * 9/1993 | Oki | 438/5 |
| 5,554,566 | * 9/1996 | Lur et al. | 438/488 |
| 5,604,157 | 2/1997 | Dai et al. | 437/200 |

OTHER PUBLICATIONS

Wolf and Tauber, Silicon Processing for the VLSI Era, vol1, p. 430 (1986), Lattice press.*

* cited by examiner

Primary Examiner—Charles Bowers
Assistant Examiner—Asok Kmar Sarkar
(74) Attorney, Agent, or Firm—George O. Saile; Stephen B. Ackerman

(57) ABSTRACT

A new method based on measuring the weight of a wafer (on which the layer of HSG has been deposited) before (W1) and after (W2) the surface of the HSG layer is coated with a layer of either photoresist or SOG. The difference delta W=W2−W1 provides an indicator of the roughness or smoothness of the surface of the deposited layer of HSG. This new method can also be based on measuring the weight W of rejected or dropped PR or SOG after the surface of the HSG layer has been coated with a layer of either photoresist or SOG. The weight of the rejected or dropped PR or SOG also provides an indicator of the roughness or smoothness of the surface of the deposited layer of HSG.

12 Claims, 2 Drawing Sheets

METHOD TO EVALUATE HEMISPERICAL GRAIN (HSG) POLYSILICON SURFACE

BACKGROUND OF THE INVENTION

(1) Field of the Invention

The invention relates to the fabrication of integrated circuit devices, and more particularly, to a method for measuring the surface quality or smoothness of a deposited layer of Hemispherical Grain (HSG) polysilicon, by coating the HSG with photoresist (PR) or Spin-On-Glass (SOG), and determining the amount or absorbed PR of SOG.

(2) Description of the Prior Art

Semiconductor manufacturing has, over the last several decades, accomplished significant improvements in device performance driven to a large degree by a continued decrease in device dimensions. This continued decrease in device dimensions has been made possible by continued improvements in the technologies that are used to create semiconductor devices, most notable are photolithography and the developments of increased contrast photoresist materials. The creation of micron and sub-micron devices brings with it the requirement that extremely small device features can be created which, in turn, brings with it the requirement that light-beams or any other source of radiation used for the creation of these features is well controlled. This control extends not only to effects of exposure energy delivery and focusing but also to avoiding reflective light scattering caused by layers underlying the exposed photoresist layers. Reflective materials, underlying the photoresist, can cause degradation in sub-micron device features to occur due to reflective light scattering.

One of the methods used to reduce the scattered light phenomenon is the use of anti-reflective coating (ARC) which is a polymer film that is, for the exposure wavelengths, highly absorbing and non-bleaching. The light absorption by the ARC coating reduces the intensity of the reflected light and, in so doing, allows critical dimensions of device feature size to be accomplished. The ARC coating can typically be applied directly to the surface of a substrate after which the photoresist can be deposited on top of the ARC coating. ARC coating can also be applied to the construction of more complex device features such as, for instance, gate structures for MOSFET devices. The ARC coating can also be combined with the deposition of other materials such as the insertion of a layer of TiN between the photoresist and the underlying gate material. This approach however results in more complex and therefore more expensive processing steps since the layer of TiN must, after the photoresist has been patterned and the gate features have been etched accordingly, be removed. This removal in turn may add to minute product contamination and further process complexity. The application of an ARC coating however partially planarizes the wafer topography thereby reducing light scattering effects. The underlying layer of ARC makes the layer of photoresist more uniform, which helps to reduce variations in line width of device features.

Wafer topography also has a significant impact on reflective light characteristics. A surface topography that has large differences in height between device features aversely affects photoresist imaging further aggravating the reflective light scattering effect during photoresist imaging.

For instance, for the creation of MOSFET devices, the device channel length is of critical importance where the shortest channel length is desired. Field oxides are created adjacent to the gate electrodes for device isolation purposes, these field oxides form relatively thick layers which leads to a rough surface topography which leads to increased light scattering effect which in turn makes the creation of critical small channel lengths more difficult.

Thin films of amorphous and polycrystalline silicon are widely used in semiconductor manufacturing. For example, amorphous silicon can be used for the formation at the gate of CMOS structures for application in the dual gate process since the amorphous silicon can effectively reduce the Boron (B) penetration from the gate to the device region. Doped polycrystalline silicon can be used to form interconnects, gate electrodes, emitter structures and resistors. These silicon thin films are typically formed by LPCVD (low pressure chemical vapor deposition) by decomposition of a silicon containing gas such as silane ($SiH_4$) or disilane ($Si_2H_6$). Doping can also be accomplished in the gas phase by introducing a dopant gas such as diborane ($B_2H_6$), arsine ($AsH_3$) or phosphine ($PH_3$). The deposition temperature during LPCVD is typically from 500 degrees C. to 675 degrees C. and the pressure is typically from 200 mTorr to 2 Torr. The crystalline structure of the 'as deposited' film is largely a function of the deposition temperature. At temperatures below about 550 degrees C. the 'as deposited' films have an amorphous structure. At temperatures between about 550 degrees C. and 580 degrees C., there is a transition between amorphous silicon and polycrystalline silicon. Hemispherical grain (HSG) polysilicon is typically grown in this transitional range. At temperatures above about 580 degrees C. the 'as deposited' films have a polycrystalline structure.

In addition to LPCVD, there are other methods for depositing thin films of amorphous and polycrystalline silicon. One such method is plasma-enhanced chemical vapor deposition (PECVD) and rf induced glow discharge is used to transfer energy into the reactant gases. Advantages of PECVD include lower substrate temperatures and higher deposition rates. A representative temperature range for PECVD of silicon thin films is about 350 degrees C. to 450 degrees C. Another method of depositing amorphous and polycrystalline silicon thin films is RTCVD (rapid thermal chemical vapor deposition). With RTCVD the structure is typically rapidly heated by lamps and the reactant gases are introduced.

One problem that occurs during deposition of in-situ doped amorphous or polycrystalline silicon thin film is the degradation of the underlying substrate film by reacting of the dopant species with contaminants on the substrate. Specifically, an underlying substrate can be attacked by acidic gasses formed by the dopant species during the deposition process. For example, with a phosphine ($PH_3$) dopant, phosphoric acid ($H_3PO_4$) can be generated by the reaction of phosphine ($PH_3$) with oxygen ($O_2$) or water ($HO_2$) present in the substrate or in the reactor chamber. Phosphoric acid is highly corrosive and can attack an underlying film such as silicon nitride ($Si_3N_4$).

These problems are compounded by the increased use of HSG or rugged polysilicon. This type of polysilicon increases the surface area and the 'trapping' area on the substrate for contaminants. In addition, during CVD of silicon, the deposition process does not occur immediately upon introduction of the reactant gasses. This gives the reactant gasses time to combine with corrosive by-products, which can attack the unprotected substrate.

The lower part (the conductive part) of a gate electrode typically is either polysilicon or amorphous silicon or a combination of both. This layer may be in-situ doped with dopant atoms or ion implanted with dopant atoms to alter the conductivity pattern of this conductive layer.

Amorphous silicon will transition into polycrystalline silicon by increasing the temperature, for instance above 550 degrees C. At this temperature, hemispherical grain (HSG) polysilicon is typically grown in this transition range. It is from the above clear that a method for the accurate evaluation of the HSG film is required.

Dynamic Random Memory (DRAM) technology has seen dramatic improvements in memory capacity driven by equally dramatic reduction in device feature sizes from 0.8 um (4M DRAM) to 0.25 um (256M DRAM). The basic unit of a DRAM cell contains one transistor and one storage capacitor. The DRAM storage capacitor can be of trench construction or a stacked capacitor type. In the construction of DRAM cells, the deposition of polysilicon layers is a significant part of this construction, for instance a layer of HSG can form the bottom electrode of the DRAM capacitor. The invention concentrates on measuring the reflectivity of an as-deposited layer of HSG on the surface of a blank wafer. The layer of HSG forms one of the layers in the construction of the capacitive unit of a DRAM cell; the quality of the deposited layer of HSG is an important factor in controlling the DRAM fabrication process. The HSG film quality can be measured by measuring the surface reflectivity of the layer of HSG. It is thereby of particular interest to derive the device ultimate capacitance value from the quality of the deposited layer of HSG. This makes it important that a correlation between this ultimate capacitance value and the Reflectivity Index (RI) of the deposited layer of HSG can be established.

FIG. 1 shows the Prior Art method of determining the surface quality of a deposited layer of HSG. A layer 12 of HSG has been deposited on the surface of a bare wafer 10. The surface shows surface irregularities 14, 16 and 18 where 14 can be described as the width of the surface roughness at the widest lower part of the surface roughness, 16 as the width of the surface roughness at the narrowest upper part of the surface roughness and 18 as the depth of the surface roughness. All of these parameters by their very nature, a indeterminate in value and can, for a theoretical analysis, only be approached by means of their statistical mean or average values. Suffice it to say at this point that a high value of 18 indicates a rough surface whereby the relative values of 14 compared with 16 gives an indication of the type of roughness of the surface. For instance a small value for the ratio 14/16 indicates that the openings at the top of the surface roughness features are large compared with the bottom areas of the roughness, the surface roughness in this case can resemble a structure of adjacent equilateral rectangles with the hypotenuse of these rectangles being in the plane of the substrate. The inverse consideration leads to a surface roughness that resembles a sequence of inverted equilateral rectangles with the hypotenuse of these rectangles being parallel to but at a distance of the plane of the substrate. The actual surface roughness can also be a combination of these two phenomenon where either one aspect or the other might dominate or might not dominate but be equally present. The key aspect is that, independent of the profile of the actual cross section of the surface roughness, a significant number of openings 20 exist between and within the deposited layer 12 of HSG.

The Prior Art method of determining HSG layer surface quality uses a Scanning Electron Microscope (SEM) analysis of this surface. This method of surface analysis is limited since it cannot detect the quantitative nature of the cross section of area 14. This area is hidden from view for the SEM and can therefore not be analyzed. It is also possible that opening 16 is narrow enough that the presence of area 14 is overlooked during the SEM based analysis.

Another Prior Art technique to evaluate the quality of the HSG surface is the measure the Reflectivity Index (RI) of the surface. This RI at best is representative of the macro-roughness of the HSG surface but overlooks, dependent on the relative dimensions of 12, 14, 16 and 18, micro aspects of the surface quality. The RI also does not correlate with the ultimate capacitance value where the HSG layer is used as the bottom plate of a DRAM capacitor.

HSG surface smoothness can be evaluated by establishing and measuring a parameter that is representative of the volume of these openings 20. The larger this volume, the rougher the surface of the deposited layer of HSG. The lower this volume, the smoother the surface of the deposited layer of HSG which, when using a layer of HSG in the construction of a semiconductor device, is the preferred HSG layer surface characteristic.

U.S. Pat. No. 5,604,157 (Dai et al.) and U.S. Pat. No. 5,554,566 (Lur et al.) show HSG process.

SUMMARY OF THE INVENTION

A principle objective of the invention is to provide a cost-effective method of evaluating the quality of a deposited layer of HSG.

It is another objective of the invention to provide a method of correlating the quality of a deposited layer of HSG with the ultimate capacitance value of a DRAM capacitor that is created using the deposited layer of HSG as the bottom electrode for the capacitor.

It is another objective of the invention to provide a method of evaluating the quality of a layer of HSG that combines high accuracy with high sensitivity and that is easy to implement in a manufacturing environment.

In accordance with the objectives of the invention a new method is provided to evaluate the surface smoothness of a layer of HSG.

Under the first embodiment of the invention, this new method is based on measuring the weight of wafer (on which the layer of HSG has been deposited) before (W1) and after (W2) the surface of the HSG layer is coated with a layer of either photoresist or SOG. Basic physics teaches that a rougher surface will absorb or adhere to more spun on material than a smoother surface. The difference delta W=W2W1 will therefore provide a direct and dependable indicator of the roughness or smoothness of the surface of the deposited layer of HSG. A large value of delta W indicates a rough surface of the HSG layer (since a large amount of spun-on material adhered to the surface of the HSG film), a small value of delta W indicates a smooth surface of the HSG layer (since a small amount of spun-on material adhered to the surface of the HSG film).

Under the second embodiment of the invention, this new method is based on measuring the weight W of rejected or dropped PR or SOG after the surface of the HSG layer has been coated with a layer of either photoresist or SOG. Basic physics teaches that a rougher surface will absorb or adhere to more spun on material than a smoother surface. The weight of the rejected or dropped PR or SOG will therefore provide a direct and dependable indicator of the roughness or smoothness of the surface of the deposited layer of HSG. The weight, W, of the dropped or rejected PR or SOG is measured after the coating of PR or SOG has been applied to the HGS surface. A large value of W indicates a smooth surface of the HSG layer (since a large amount of spun-on material was rejected by the surface of the HSG film), a small value of delta W indicates a rough surface of the HSG layer (since a large amount of spun-on material adhered to the surface of the HSG film).

DESCRIPTION OF THE PREFERRED EMBODIMENTS

Figure 1:
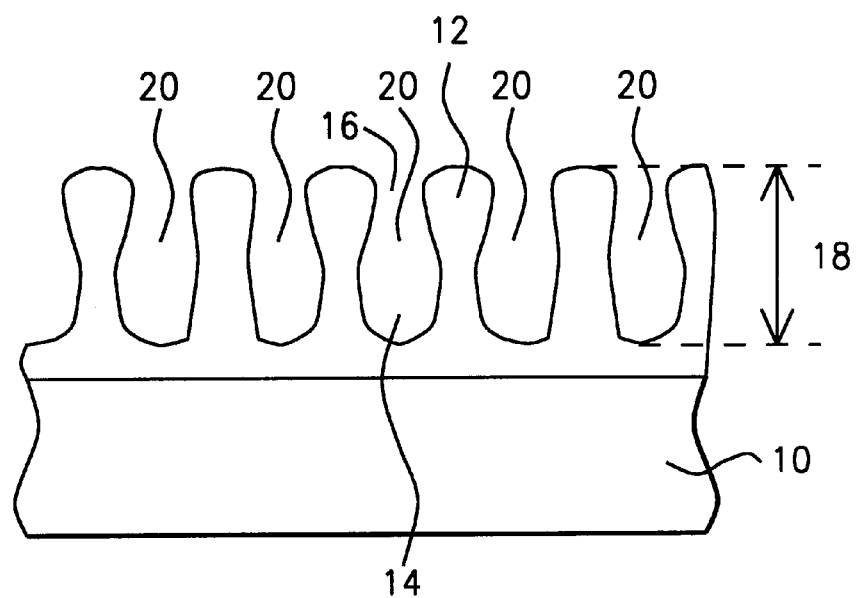
FIG. 1 shows the Prior Art method of measuring HSG film surface quality.
Figure 2:
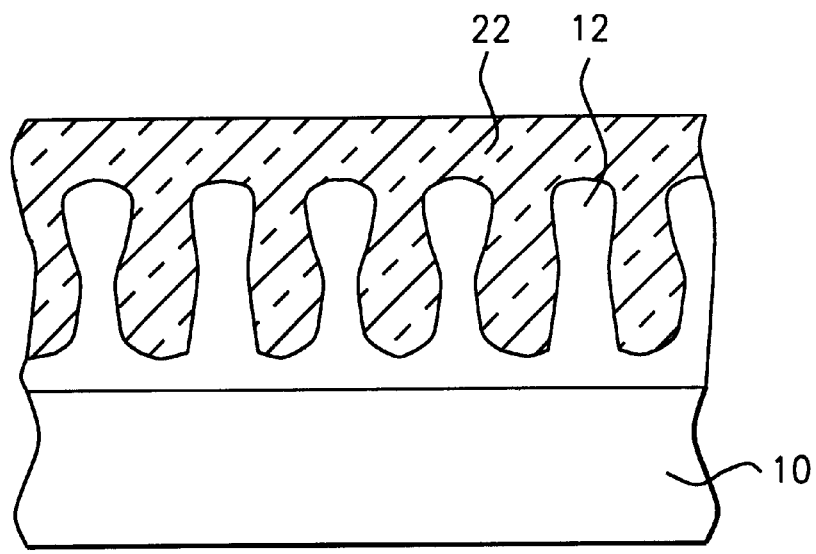
FIG. 2 shows the method of measuring HSG film surface quality of the invention.

Referring now specifically to FIG. 2, there is shown a cross section of the bare substrate 10 on which a layer 12 of HSG has been deposited. Over the layer 12 of HSG has been spun-on a layer 22 of photoresist or SOG.

Under the first embodiment of the invention, before the layer 22 of PR or SOG is deposited, the weight of the wafer is determined as W1, after the layer 22 of PR or SOG has been deposited the weight of the wafer (including the weight of the spun-on material) is again determined as W2. The spun-on material that has adhered to the surface of the wafer is indicative of the roughness of the surface of the HSG layer, the rougher the surface the more material can adhere to the surface. Constant factors during the deposition of the PR or SOG are the spin rate and the amount of material spun-on per time unit (drop amount). The delta W=W2W1 is calculated, a high value indicates a rough surface of the HSG layer, a low value indicates a smooth surface of the HSG layer. This value (of delta W) correlates directly with the ultimate value of the capacitor that is being created and in which this layer of HSG forms the bottom plate: the smoother the surface of the layer of HSG (low value of delta W) the better the bottom plate can contact the capacitor dielectric, the higher the capacitor value that can be created. Therefore: small value of delta W translates into high value of device capacitance. High value of delta W translates into low value of capacitance.

Under the second embodiment of the invention, the surface of the HSG film is coated with PR or SOG, conditions for the spin on process such as spin on rate are known and fixed. Rejected or dropped PR or SOG is collected during the spin on process; this amount is measured at the completion of the spin on process. A rough HSG surface adheres to more spun on PR or SOG and will therefore drop less PR or SOG. A rough HSG surface will therefore yield a low value for W. The inverse is equally true: a smooth or high quality HSG surface will result in a high value for the weight of the rejected or dropped PR or SOG.

Figure 3:
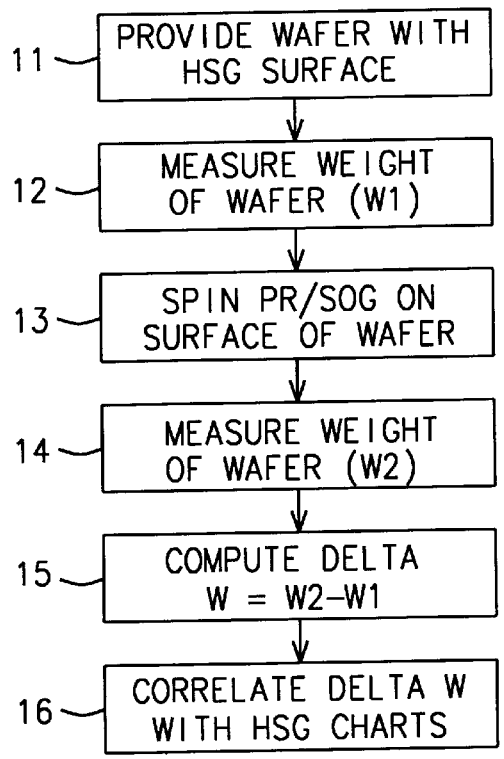
FIG. 3 shows a flow chart of the sequence of steps required to determine HSG surface smoothness in accordance with the first embodiment of the invention.

FIG. 3 shows a flow diagram of the steps required to determine HSG surface quality in accordance with the first embodiment of the invention. A wafer on which a layer of HSG has been created is obtained as the first step, 11, of the procedure; the quality of the surface of the HSG layer is to be determined for this wafer. The weight (W1) is this wafer is determined, step 12. A coating of PR or SOG is applied to the wafer under known and strictly controlled conditions of spin on coating, step 13. After completion of the spin on coating step, the weight (W2) of the wafer is again determined, step 14. The change in weight between before and after the coating of the HSG surface is determined as delta W=W2W1, step 15. Prior experiments have determined the correlation between delta W and HSG surface quality. The delta W that has been obtained as part of the subject sequence is matched with the delta W on this chart, the corresponding HSG surface quality is derived from the comparison, step 16.

Figure 4:
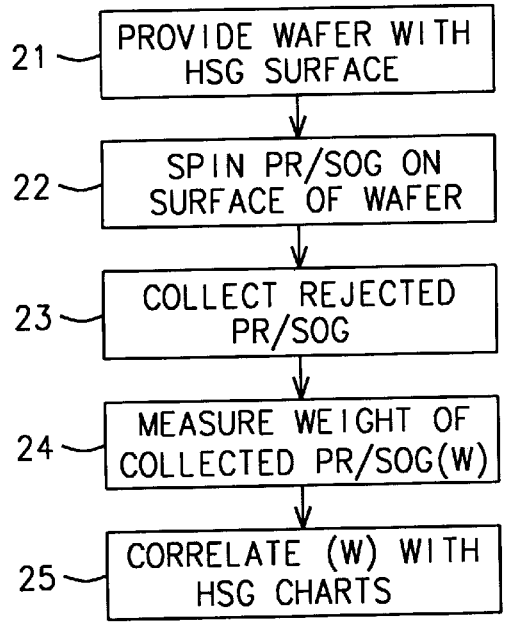
FIG. 4 shows a flow chart of the sequence of steps required to determine HSG surface smoothness in accordance with the second embodiment of the invention.

FIG. 4 shows a flow diagram of the steps required to determine HSG surface quality in accordance with the second embodiment of the invention. A wafer on which a layer of HSG has been created is obtained as the first step of the procedure, step 21. The quality of the surface of the HSG layer is to be determined for this wafer. A coating of PR or SOG is spun onto the HSG surface, step 22. This process is performed under known processing (spin on) conditions. The PR or SOG that is rejected (that does not adhere to) the HSG surface is collected during the spin on process, step 23. After the coating of the HSG surface has been completed, the weight (W) of the collected PR or SOG is determined, step 24. Prior experiments have determined the correlation between this W and HSG surface quality. The W that has been obtained as part of the subject sequence is matched with the W on this chart, the corresponding HSG surface quality is derived from the comparison, step 25.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of characterizing a Hemispherical Grain (HSG) polysilicon layer and a photoresist comprising:
   providing a semiconductor substrate;
   forming a layer of Hemispherical Grain (HSG) polysilicon layer on the surface of said substrate;
   weighing said substrate thereby including said HSG layer resulting in weight 1;
   depositing a layer of photoresist over said layer of HSG;
   weighing said substrate thereby including said HSG layer thereby further including said deposited layer of photoresist resulting in weight 2;
   subtracting said weight 1 from said weight 2 resulting in delta weight; and
   deriving a HSG surface smoothness indicator by using charts that correlate said delta weight with HSG surface smoothness indicators such as capacitance.

2. The method of claim 1 wherein said forming a layer of Hemispherical Grain (HSG) polysilicon layer is a chemical vapor deposition of a polysilicon layer at a temperature between about 550 degrees C. and 580 degrees C. at a pressure below 300 mTorr to a thickness between about 500 and 4000 Angstrom.

3. The method of claim 1 wherein said charts provide a one-to-one correlation between HSG surface quality or smoothness and methods and conditions of delivery of said photoresist to said HSG surface such as but not limited to photoresist delivery rate, photoresist delivery pressure, photoresist temperature at the time of delivery, the viscosity or molecular density of the photoresist at the time of delivery, the density or concentration of the photoresist spray at the time of impact with said HSG surface, the angle of impact of said photoresist with said HSG surface, the temperature and temperature profile of said HSG surface, speed differential between said photoresist and said HSG surface at the time of impact of said photoresist with said HSG surface, spin rate of said HSG surface.

4. A method of characterizing Hemispherical Grain (HSG) polysilicon layer and a Spin-On-Glass (SOG) comprising:

providing a semiconductor substrate;

forming a layer of Hemispherical Grain (HSG) polysilicon layer on the surface of said substrate;

weighing said substrate thereby including said HSG layer resulting in weight 1;

depositing a layer of Spin-On-Glass (SOG) over said layer of HSG;

weighing said substrate thereby including said HSG layer thereby further including said deposited layer of Spin-On-Glass resulting in weight 2;

subtracting said weight 1 from said weight 2 resulting in delta weight; and deriving a HSG surface smoothness indicator by using charts that correlate said delta weight with HSG surface smoothness indicators such as capacitance.

5. The method of claim 4 wherein said forming a layer of Hemispherical Grain (HSG) polysilicon layer is a chemical vapor deposition of said polysilicon layer at a temperature between about 550 degrees C. and 580 degrees C. at a pressure below 300 mTorr to a thickness between about 500 and 4000 Angstrom.

6. The method of claim 4 wherein said charts provide a one-to-one correlation between HSG surface quality or smoothness and methods and conditions of delivery of said Spin-On-Glass to said HSG surface such as but not limited to Spin-On-Glass delivery rate, Spin-On-Glass delivery pressure, Spin-On-Glass temperature at the time of delivery, the viscosity or molecular density of the Spin-On-Glass at the time of delivery, the density or concentration of the Spin-On-Glass spray at the time of impact with said HSG surface, the angle of impact of said Spin-On-Glass with said HSG surface, the temperature and temperature profile of said HSG surface, speed differential between said Spin-On-Glass and said HSG surface at the time of impact of said Spin-On-Glass with said HSG surface, spin rate of said HSG surface.

7. A method of characterizing a Hemispherical Grain (HSG) polysilicon layer and a photoresist deposited on the bare surface of a semiconductor substrate comprising:

forming a Hemispherical Grain (HSG) polysilicon layer by chemical vapor deposition of said polysilicon layer at a temperature between about 550 degrees C. and 580 degrees C. at a pressure below 300 mTorr to a thickness between about 500 and 4000 Angstrom and resulting in a hemispherical grained polysilicon surface as deposited;

measuring the weight of said semiconductor substrate thereby including said HSG layer resulting in a weight 1;

depositing said photoresist on said hemispherical grained polysilicon surface;

measuring the weight of said semiconductor substrate thereby including said HSG layer thereby further including said deposited photoresist resulting in a weight 2;

subtracting weight 1 from weight 2 resulting in delta weight; and deriving HSG surface smoothness indicators by using charts that correlate said delta weight with HSG surface smoothness indicators such as capacitance.

8. A method of characterizing a Hemispherical Grain (HSG) polysilicon layer and Spin-On-Glass (SOG) deposited on the bare surface of a semiconductor substrate comprising:

forming a Hemispherical Grain (HSG) polysilicon layer by chemical vapor deposition of said polysilicon layer at a temperature between about 550 degrees C. and 580 degrees C. at a pressure below 300 mTorr to a thickness between about 500 and 4000 Angstrom and resulting in a hemispherical grained polysilicon surface as deposited;

measuring the weight of said semiconductor substrate thereby including said HSG layer resulting in a weight 1;

depositing said Spin-On-Glass on said hemispherical grained polysilicon surface;

measuring the weight of said semiconductor substrate thereby including said HSG layer thereby further including said deposited Spin-On-Glass resulting in a weight 2;

subtracting weight 1 from weight 2 resulting in delta weight; and deriving HSG surface smoothness indicators by using charts that correlate said delta weight with HSG surface smoothness indicators such as capacitance.

9. A method of characterizing a Hemispherical Grain (HSG) polysilicon layer and photoresist deposited on the bare surface of a semiconductor substrate comprising:

forming a Hemispherical Grain (HSG) polysilicon layer by chemical vapor deposition of said polysilicon layer at a temperature between about 550 degrees C. and 580 degrees C. at a pressure below 300 mTorr to a thickness between about 500 and 4000 Angstrom and resulting in a hemispherical grained polysilicon surface as deposited;

depositing said photoresist on said hemispherical grained polysilicon surface;

collecting photoresist not absorbed by said hemispherical grained polysilicon surface during said depositing said photoresist;

measuring the weight of said collected photoresist resulting in a weight W; and correlating said weight W with known polysilicon structure characteristics such as capacitance thereby determining the surface characteristics of said layer of HSG.

10. The method of claim 9 wherein said correlation provides a one-to-one correlation between HSG surface quality or smoothness and methods and conditions of delivery of said photoresist to said HSG surface such as but not limited to initial quantity by weight of the photoresist that is used for the coating of said HSG surface, photoresist delivery rate, photoresist delivery pressure, photoresist temperature at the time of delivery, the viscosity or molecular density of the photoresist at the time of delivery, the density or concentration of the photoresist spray at the time of impact with said HSG surface, the angle of impact of said photoresist with said HSG surface, the temperature and temperature profile of said HSG surface, speed differential between said photoresist and said HSG surface at the time of impact of said photoresist with said HSG surface, spin rate of said HSG surface.

11. A method of characterizing a Hemispherical Grain (HSG) polysilicon layer and Spin-On-Glass deposited on the bare surface of a semiconductor substrate comprising:

forming a Hemispherical Grain (HSG) polysilicon layer by chemical vapor deposition of said polysilicon layer at a temperature between about 550 degrees C. and 580 degrees C. at a pressure below 300 mTorr to a thickness between about 500 and 4000 Angstrom and resulting in a hemispherical grained polysilicon surface as deposited;

depositing said Spin-on-Glass on said hemispherical grained polysilicon surface;

collecting Spin-On-Glass not absorbed by said hemispherical grained polysilicon surface during said depositing said Spin-On-Glass;

measuring the weight of said collected Spin-On-Glass resulting in a weight W; and correlating said weight W with known polysilicon structure characteristics such as capacitance thereby determining the surface characteristics of said layer of HSG.

12. The method of claim 11 wherein said correlation provides a one-to-one correlation between HSG surface quality or smoothness and methods and conditions of delivery of said Spin-On-Glass to said HSG surface such as but not limited to initial quantity by weight of the Spin-On-Glass that is used for the coating of said HSG surface Spin-On-Glass delivery rate, Spin-On-Glass delivery pressure, Spin-On-Glass temperature at the time of delivery, the viscosity or molecular density of the Spin-On-Glass at the time of delivery, the density or concentration of the Spin-On-Glass spray at the time of impact with said HSG surface, the angle of impact of said Spin-On-Glass with said HSG surface, the temperature and temperature profile of said HSG surface, speed differential between said Spin-On-Glass and said HSG surface at the time of impact of said Spin-On-Glass with said HSG surface, spin rate of said HSG surface.

\* \* \* \* \*

UNITED STATES PATENT AND TRADEMARK OFFICE
CERTIFICATE OF CORRECTION

PATENT NO. : 6,194,234 B1  Page 1 of 1
DATED : February 27, 2001
INVENTOR(S) : Kuo-Ching Huang, Tse-Liang Ying, Wen-Chuan Chiang, Yu-Hua Lee It is certified that error appears in the above-identified patent and that said Letters Patent is hereby corrected as shown below:

<u>Title page,</u>
Item [75], correct "Kaohsinng" so that is reads -- Kaohsiung --

Signed and Sealed this

Sixteenth Day of October, 2001

Attest:

*Nicholas P. Godici*

NICHOLAS P. GODICI
*Attesting Officer*  *Acting Director of the United States Patent and Trademark Office*